United States Patent [19]
Kumagai

[11] Patent Number: 5,576,661
[45] Date of Patent: Nov. 19, 1996

[54] FREQUENCY CHARACTERISTIC OF SEMICONDUCTOR DEVICE IN ULTRA-HIGH FREQUENCY BAND

[75] Inventor: Akira Kumagai, Yamagata, Japan

[73] Assignee: NEC Corporation, Tokyo, Japan

[21] Appl. No.: 428,349

[22] Filed: Apr. 25, 1995

[30] Foreign Application Priority Data

Apr. 28, 1994 [JP] Japan ................................ 6-090883

[51] Int. Cl.$^6$ ................................................. H03F 3/193
[52] U.S. Cl. .......................... 330/277; 330/286; 330/295
[58] Field of Search ................................. 330/277, 286, 330/295

[56] References Cited

U.S. PATENT DOCUMENTS 4,353,047  10/1982  Noguchi et al. ................. 330/286 X
5,132,641   7/1992  Khandavalli ..................... 330/277 X

FOREIGN PATENT DOCUMENTS 0411919  2/1991  European Pat. Off. .

OTHER PUBLICATIONS

Patent Abstracts of Japan, vol. 12, No. 189 (E–616) Dec. 1987.

Patent Abstracts of Japan, vol. 17, No. 657 (E–1470) Aug. 1993.

*Primary Examiner*—James B. Mullins
*Attorney, Agent, or Firm*—Sughrue, Mion, Zinn, Macpeak & Seas

[57] ABSTRACT

An ultra-high frequency semiconductor device according to another aspect of the present invention, includes Field Effect transistor (FET) chips each of which includes FET elements and which are connected to each other by bonding wires, and an internal matching circuit having a concentrated parameter circuit and a distributed parameter circuit, and wherein the concentrated parameter circuit includes capacitor chips provided on input and output sides of the FET chips and including a plurality of chip capacitors each of which is connected to said corresponding FET elements, and wherein each of the chip capacitors has a length predetermined based on a frequency band used in practice. Each of said chip capacitors may have a length predetermined such that a resonance frequency does not exist in a frequency band used in practice or a length predetermined such that an input impedance of each of said chip capacitors is capacitive at an upper limit frequency of the frequency band.

13 Claims, 7 Drawing Sheets

FREQUENCY CHARACTERISTIC OF SEMICONDUCTOR DEVICE IN ULTRA-HIGH FREQUENCY BAND

BACKGROUND OF THE INVENTION

1. Field of the Invention

The present invention relates to a semiconductor device having a plurality of GaAs metal-semiconductor field effect transistors (to be referred to as "GaAs MES FETs" hereinafter), and more particularly, to an improvement of frequency characteristic of a semiconductor device, such as a GaAs MES FET, in an ultra-high frequency band, such as a microwave frequency band.

2. Description of Related Art

Figure 1:
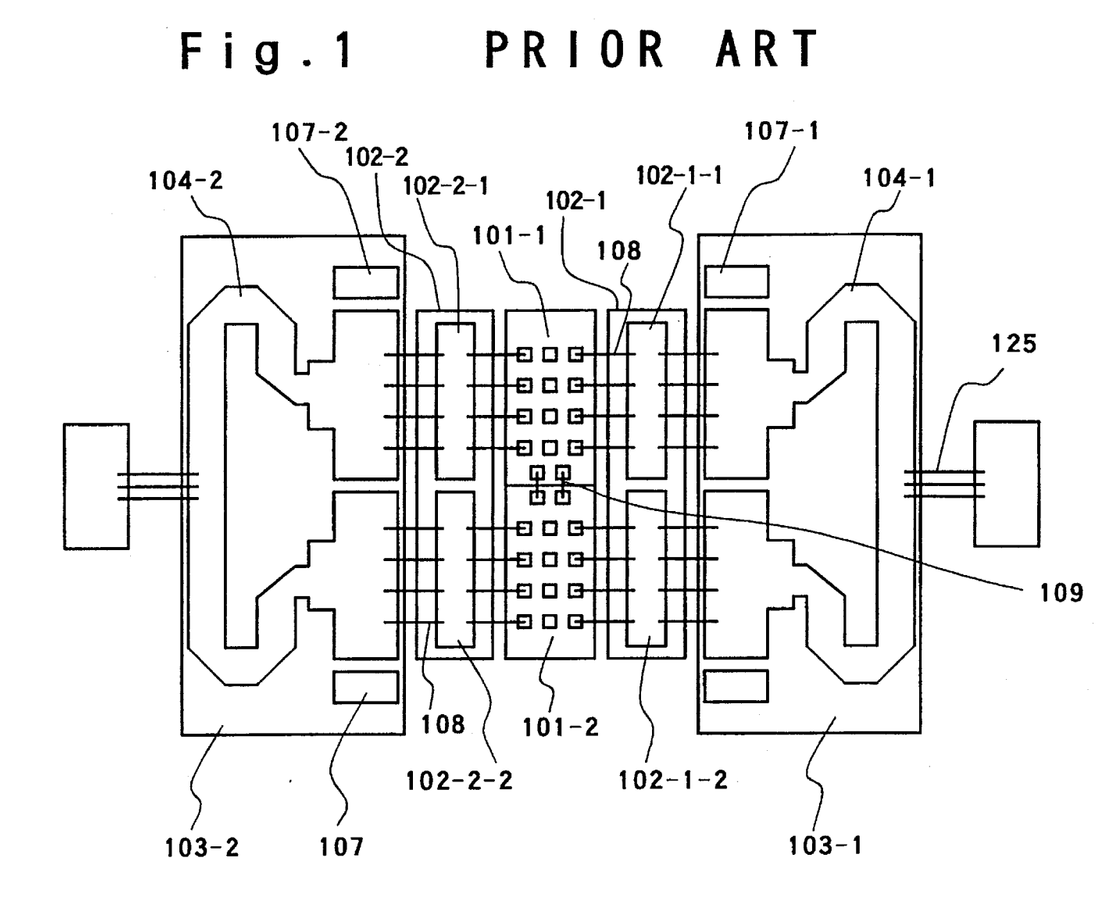
FIG. 1 is a plan view of an example of conventional semiconductor device used in an ultra-high frequency band.
Figure 2:
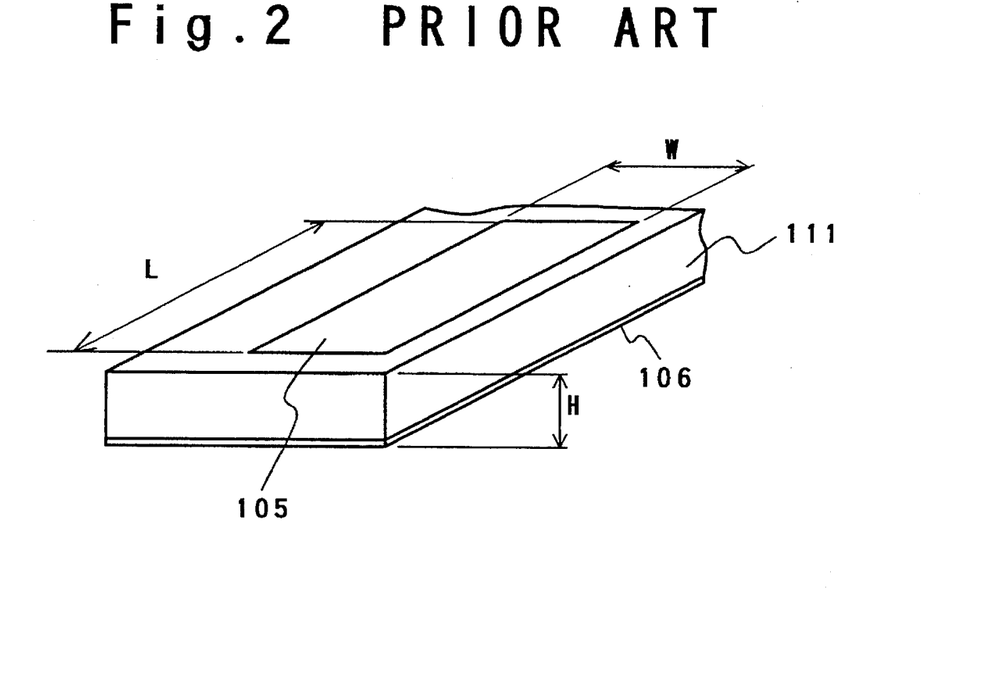
FIG. 2 is a partial perspective view of the capacitor chip used in the conventional semiconductor device shown in FIG. 1.

FIG. 1 is a diagram showing a 50 Ω impedance-matching circuit of a semiconductor device for power amplification which is used in an ultra-high frequency band, such as a microwave frequency band. Referring to FIG. 1, the semiconductor device includes two GaAs MES FET chips ("FET chips" hereinafter) 101 on which two FET circuits are respectively formed. Each FET circuit has 4 GaAs MES FET elements. The FET circuits are connected to each other by two bonding wires 109. The FET chips 101 are mounted on a package (not shown). Capacitor chips 102 are respectively provided on both sides of the FET chips 101, i.e., the input and output sides of the FET chips. Each capacitor chip 102 is provided with 2 chip capacitors 102-1 and 102-2. As shown in FIG. 2, each chip capacitor is formed of a dielectric substance 111 having a height H and a relative dielectric constant $\epsilon_r$, an upper surface metalized pattern 105 as an upper electrode having a width W and a length L, and a lower electrode 106. Input or output terminals of each FET chip are connected to the corresponding chip capacitor by 4 bonding wires 108 in parallel. Dielectric substance substrates 103 are respectively provided on the outsides of the capacitor chips 102, i.e., on the input and output sides. A microstrip transmission line 104 having branch ports in the shape of ring with a small gap and open stub patterns 107 is formed on each of the substrates 103. Each microstrip transmission line 104 is connected each of the corresponding chip capacitors by 4 bonding wires. In this manner, on the semiconductor circuit, a concentrated parameter circuit is constituted of the chip capacitors 102-1 and 102-2, bonding wires 108 and the like, and a distributed parameter circuit is constituted of the microstrip transmission line 104 and the open stub patterns 107 formed on the dielectric substance substrate 103.

Figure 3:
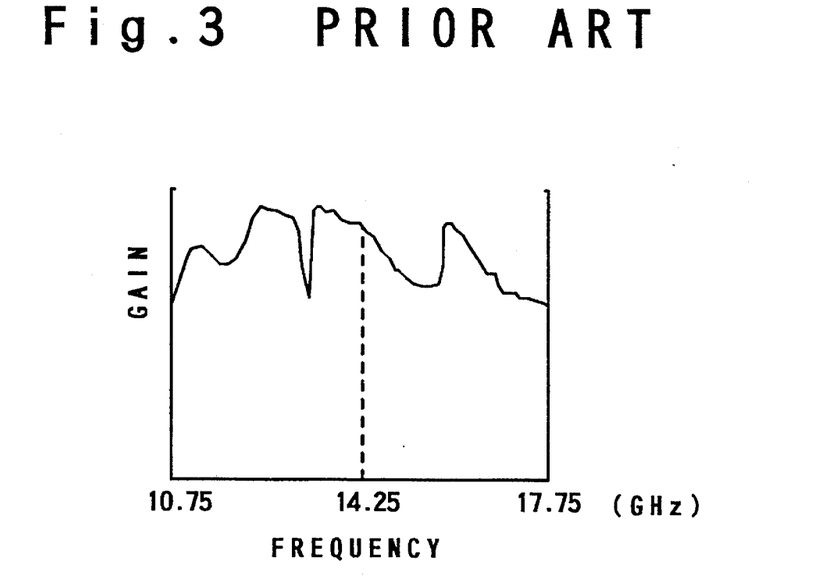
FIG. 3 is a diagram showing the frequency characteristic of the conventional semiconductor device shown in FIG. 1.

The upper surface metalized pattern is conventionally formed for each FET circuit. The frequency characteristic of the semiconductor device in this case is shown in FIG. 3. The frequency characteristic has a non-flat portion within a practical frequency band (±5 to 15%) having a center frequency of 14.25 GHz, for example, and has a local portion with gain greatly reduced, i.e., a discontinuous point, as shown in FIG. 3.

There are problems with the semiconductor circuit operating in an ultra-high frequency band in the following matters.

That is, the upper surface metalized pattern having a length L which is formed on the surface of a capacitor chip has a resonance frequency within an operation frequency band. Therefore, there is caused a problem in that the operation of the semiconductor device becomes unstable and a discontinuous point of gain, i.e., a point at which gain is locally reduced appears within the operation frequency band.

The FET chips or GaAs FET elements are manufactured in the same manner but are not completely identical so that a very small unbalance exists among the GaAs FET elements. As a result, a signal which is amplified using the bonding wires, the upper surface metalized pattern on the chip capacitor, and the dielectric substance substrate as medium is transferred between the FET circuits or GaAs FET elements from one to the other. Such a phenomenon adversely influences the matching state of the semiconductor device and, therefore, the operation of semiconductor device becomes unstable such that the discontinuous point appears.

In a case where the capacitor chips are fixed to the package with solder such as AuSn, bubbles are sometimes taken into the AuSn solder, partially producing portions where the lower surface metalized pattern of the capacitor chip does not contact the ground portion of the package, resulting in a random distribution of capacitance. For this reason, a relative potential difference is induced between the upper surface metalized patterns on the capacitor chip, or between the branch ports on the dielectric substance substrate. This also causes the discontinuous point within the operation frequency band.

SUMMARY OF THE INVENTION

The present invention has, as an object, to provide an ultra-high frequency semiconductor device in which a discontinuous region can be prevented from being generated within a frequency band in a frequency characteristic.

Another object of the present invention is to provide an ultra-high frequency semiconductor device in which a discontinuous region in a frequency characteristic can be prevented from being generated due to unbalance between FET chips.

Still another object of the present invention is to provide an ultra-high frequency semiconductor device in which a discontinuous region in a frequency characteristic can be prevented from generated due to the manufacturing process.

An ultra-high frequency semiconductor device according to the present invention, includes Field Effect transistor (FET) chips each of which includes FET elements and which are connected to each other by bonding wires, capacitor chips provided on input and output sides of the FET chips and including a plurality of chip capacitors each of which is connected to the corresponding FET elements, and dielectric substance substrates each of which has open stub patterns and a microstrip transmission line formed thereon, and each of the microstrip transmission line being connected to the corresponding chip capacitors by bonding wires, and wherein each of the chip capacitors has a length predetermined based on a frequency band used in practice.

An ultra-high frequency semiconductor device according to another aspect of the present invention, includes Field Effect transistor (FET) chips each of which includes FET elements and which are connected to each other by bonding wires, and an internal matching circuit having a concentrated parameter circuit and a distributed parameter circuit, and wherein the concentrated parameter circuit includes capacitor chips provided on input and output sides of the FET chips and including a plurality of chip capacitors each of which is connected to the corresponding FET elements, and wherein each of the chip capacitors has a length predetermined based on a frequency band used in practice.

Each of the capacitor chips may include a dielectric substance, a lower surface metalized pattern formed on a whole lower surface of the dielectric substance, and an upper surface metalized pattern.

Each of the chip capacitors may have a length predetermined such that a resonance frequency does not exist in a frequency band used in practice or a length predetermined such that an input impedance of each of the chip capacitors is capacitive at an upper limit frequency of the frequency band.

The length preferably is shorter than 0.25 $\lambda_g$ and longer than 0.15 $\lambda_g$, where $\lambda_g$ is a wave length corresponding to a center frequency of the frequency band.

DESCRIPTION OF THE PREFERRED EMBODIMENT

A semiconductor device according to the present invention will be described below with reference to the accompanying drawings.

Figure 4:
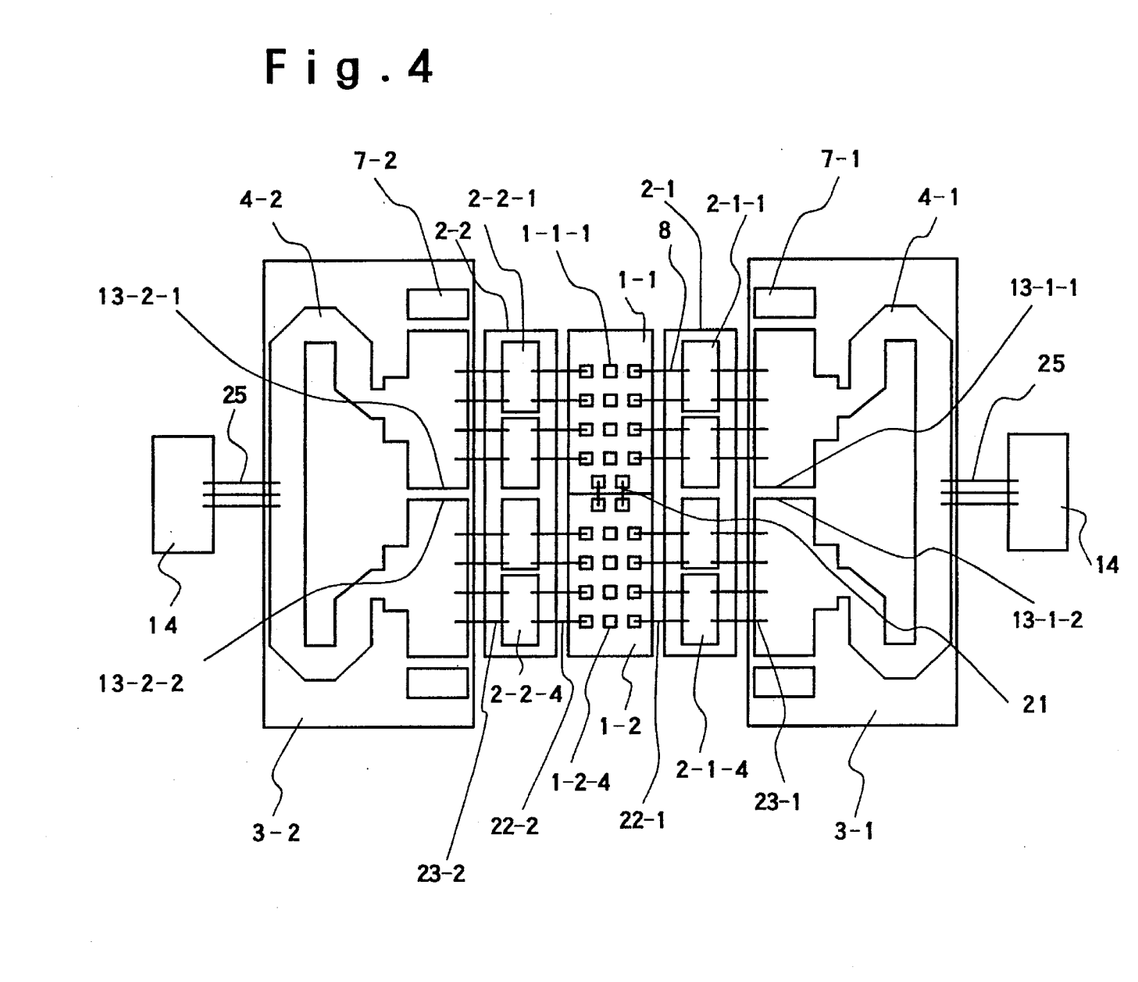
FIG. 4 is a plan view of a semiconductor device according to an embodiment of the present invention.
Figure 5:
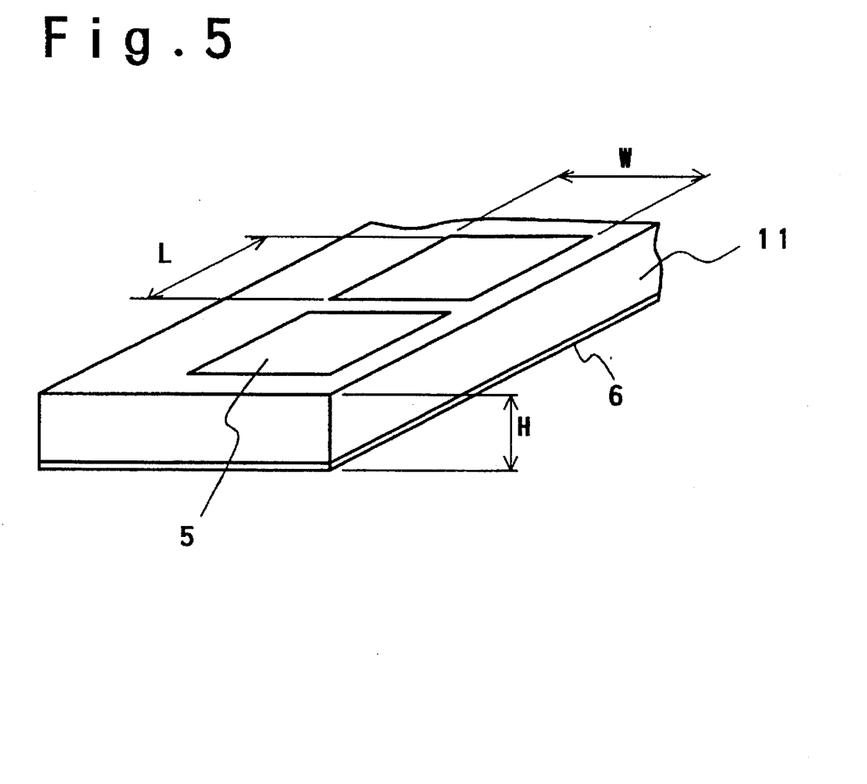
FIG. 5 is a partial perspective view of the capacitor chip used in the semiconductor device according to the embodiment shown in FIG. 4.
Figure 6:
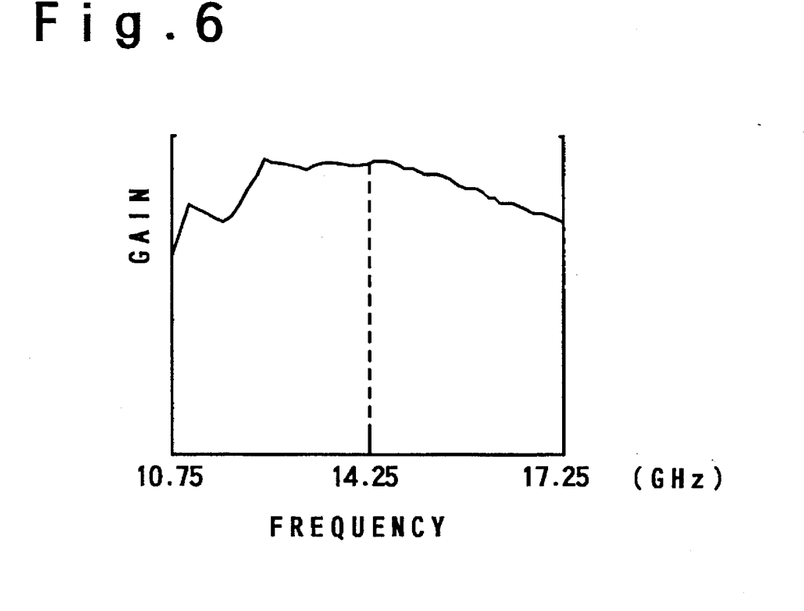
FIG. 6 is a diagram showing the frequency characteristic of the semiconductor device according to the embodiment shown in FIG. 4.

FIG. 4 is a plan view of the semiconductor device according to an embodiment of the present invention and FIG. 5 is a partial expansion view of a chip capacitor shown in FIG. 4.

As shown in FIG. 4, the semiconductor device includes two GaAs MES FET chips 1-1 and 1-2 on which two FET circuits are respectively formed. Each FET circuit has 4 FET elements 1-1-1 to 1-1-4, 1-2-1 to 1-2-4) in this embodiment. The two FET chips 1-1 and 1-2 are connected to each other by bonding wires 21. Capacitor chips 2-1 and 2-2 are provided on either side of the FET chips 1-1 and 1-2, i.e., the input and output sides of the FET chips 1-1 and 1-2. Each capacitor chip is provided with 4 chip capacitors 2-1-1 to 2-1-4; 2-2-1 to 2-2-4. Each chip capacitor is formed as shown in FIG. 5. That is, the chip capacitor is formed of a dielectric substance 11 having a height H and a relative dielectric constant $\epsilon_r$ in a range of 40 to 300, an upper surface metalized pattern 5 as an upper electrode having a width W and a length L, and a lower surface metalized pattern as a lower electrode 6. As a result, the chip capacitor generally has a capacitance of $WL\epsilon_0\epsilon_r/H$, where $\epsilon_0$ is the dielectric constant in vacuum space. An input or output terminal of each FET element is connected to the corresponding chip capacitor by a bonding wire 22 (22-1 and 22-2). Dielectric substance substrates 3 (3-1 and 3-2) are provided on the outsides of the capacitor chips 2-1 and 2-2, i.e., on the input side of the chip capacitor 2-2 and the output side of the chip capacitor 2-1. A microstrip transmission line 4 (4-1 and 4-2) having branch ports 13-1 (-1 and -2) and 13-2 (-1 and -2) in the shape of ring with a small gap, and open stub patterns 7 (7-1 and 7-2) are formed on each of the substrates 3. Each of the branch ports 13-1 and 13-2 of the microstrip transmission lines 4 is connected to the corresponding chip capacitors by bonding wires 23 (23-1 and 23-2). The microstrip transmission line 4 is connected to an input or output port 14 by bonding wires 25. In this manner, on the semiconductor device, a concentrated parameter matching circuit is constituted of the chip capacitors 2-1 and 2-2, bonding wires 23 and bonding wires 25, etc., and a distributed parameter matching circuit is constituted of the microstrip transmission lines 4 and the open stub patterns 7 formed on the dielectric substance substrates 3.

Next, the internal matching in the semiconductor device according to the present invention will be described below.

As described above, the chip capacitor of the internal matching circuit is constituted of an upper surface metalized pattern 5 having a length L and a width of W, and formed on the upper surface of a dielectric substance 11 which has a thickness of H, and a lower surface metalized layer 6 on a lower surface of the dielectric substance 11, as shown in FIG. 5. The capacitance C of the chip capacitor is basically expressed by the following equation.

$$C = \epsilon_0 \cdot \epsilon_r \cdot (L \times W)/H \qquad (1)$$

where $\epsilon_0$ is the dielectric constant in the vacuum space and $\epsilon_r$ is a relative dielectric constant of the dielectric substance 11.

Here, as for the capacitance in the practical microwave frequency band, it is necessary to take into account a stray capacitance caused between the upper surface metalized pattern 5 and a ground (package) with which the lower surface metalized pattern 6 is in contact and the frequency dispersion of the relative dielectric constant of the dielectric substance 11 (increment of $\epsilon_r$ as a frequency is increased). When the width W of the upper surface metalized pattern 5 is 0.55 mm, the thickness H of the dielectric substance 11 is 0.15 mm, a relative dielectric constant is 65, and a frequency is 14.25 GHz, an effective relative dielectric constant $\epsilon_{eff}$ is $$\begin{aligned} \epsilon_{eff} &= (\epsilon_r + 1)/2 + (\epsilon_r - 1)/2 \cdot \{1 + 12 \cdot (H/W)\}^{-(1/2)} \\ &= 48.48 \end{aligned} \qquad (2)$$

The characteristic impedance $Z_0$ of the chip capacitor is $$\begin{aligned} Z_0 &= \{120\pi/(\epsilon_{eff})^{(1/2)}\} \{(W/H) + 1.392 + \\ &\quad 0.667 \cdot \ln((W/H) + 1.444)\}^{(-1)} \\ &= 8.81(\Omega) \end{aligned} \qquad (3)$$

Note that the wavelength $\lambda_g$ on the dielectric substance 11 of the chip capacitor can be obtained from the following calculation.

$$\begin{aligned} \lambda_g &= \{(\text{light velocity in vacuum } C_0)/\text{Freq}\} \times (\epsilon_{eff})^{(-1/2)} \\ &= 2.97(\text{mm}) \end{aligned} \qquad (4)$$

Figure 7:
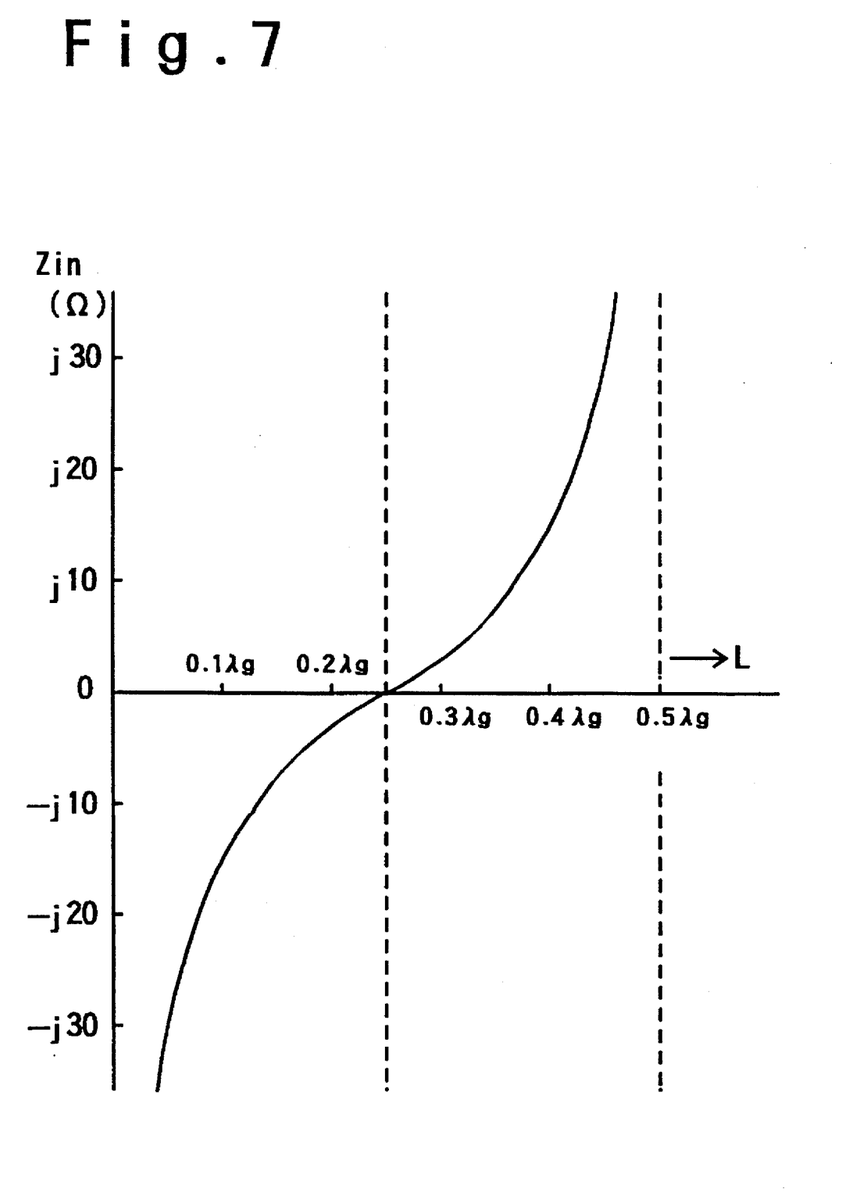
FIG. 7 is a diagram showing a relation between the input impedance and the length L of the chip capacitor provided to the capacitor chip shown in FIG. 5.

Therefore, input impedance $Z_{in}$ when the chip capacitor is assumed as a transmission line having an open terminal can be calculated from the following equation (5)

$$Z_{in}=-jZ_0\cot\beta L \quad (5)$$

where $Z_0$ is a characteristic impedance and $\beta$ is a propagation constant. As seen from the above equations, the input impedance of the chip capacitor can be expressed as a function of the length L of the upper surface metalized pattern 5. The calculation result of the input impedance with respect to the length L, the input impedance when the length L is varied from $0.05 \lambda_g$ to $0.5 \lambda_g$ is shown in FIG. 7. In FIG. 7, the input impedance $Z_{in}$ is inductive in the upper half of FIG. 7 and capacitive in the lower half of FIG. 7. That is, as shown in FIG. 7, when the length L of the chip capacitor is in a range of $0.05 \lambda_g$ to $0.25 \lambda_g$, the input impedance functions as a capacitance component (capacitive), and when the length L is in a range of $0.25 \lambda_g$ to $0.5 \lambda_g$, the input impedance functions as an inductance component (inductive). As seen from the above equations, the width W of the upper surface metalized pattern 5 and the thickness H of the dielectric substance 11 contribute to the inclination of the input impedance curve but does not contribute to whether the input impedance is inductive or capacitive.

Next, an experiment result will be described below. The inventor made three samples La, Lb and Lc employing the chip capacitors having the lengths of $0.143 \lambda_g$, $0.2 \lambda_g$ and $0.3 \lambda_g$ as the upper surface metalized pattern length, respectively, where $\lambda_g$ is a center frequency of the operation frequency band in practice. Then, the frequency characteristic of each sample is measured. The measuring method will be briefly described. The sample was mounted on a tool using microstrip lines and voltages were supplied to the sample from a bias circuit, a gate power supply, and a drain power supply. A small microwave signal from a signal generator was amplified by an amplifier and supplied to the sample. A part of the microwave signal was taken out by a directional coupler and monitored by a power meter through a microwave signal detector. The amplitude of the microwave signal to be supplied to the sample was controlled with an attenuator. A part of an output from the sample was taken out by a direction coupler and monitored by a network analyzer through a microwave signal detector. In this case, the frequency characteristic of the sample can be exactly measured by the network analyzer without the need to take a loss value of the measuring system into account, because the part of the microwave signal monitored through the directional coupler and the microwave signal detector was negatively fed back to the signal generator such that a predetermined amount of power of the microwave signal is applied to the sample, even if a predetermined frequency range was always swept by the signal generator.

Figure 8:
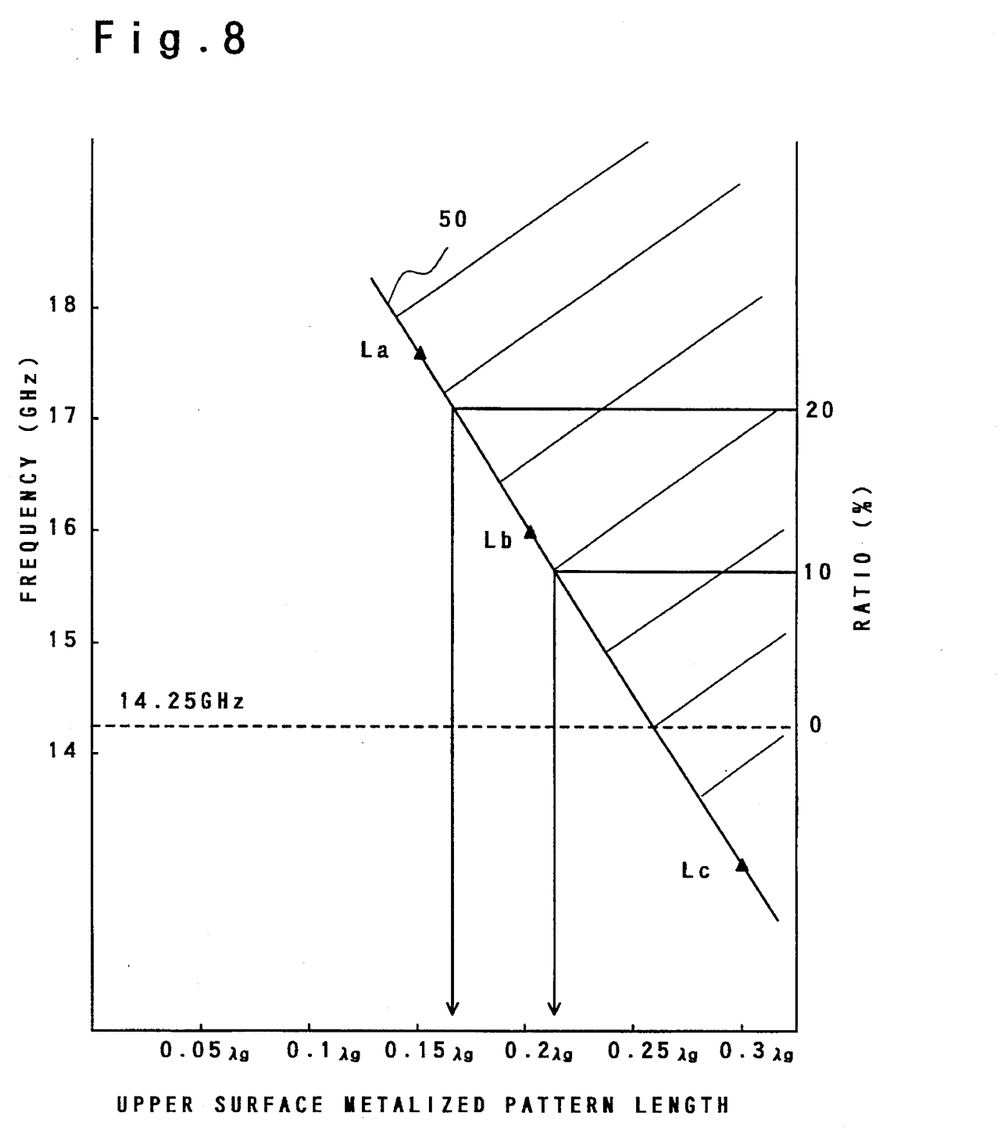
FIG. 8 is a diagram showing an experiment result on samples of semiconductor device in which the chip capacitors have different lengths.

FIG. 8 shows the measuring result. As shown in FIG. 8, the sample Lc having the upper surface metalized pattern length of $0.3 \lambda_g$ has a discontinuous point at a point of 13.05 GHz in the frequency characteristic. Similarly, the samples Lb and La having the metalized pattern lengths of $0.2 \lambda_g$ and $0.143 \lambda_g$ have the discontinuous points at points of 16.05 GHz and 17.75 GHz in the frequency characteristic. The frequency points where the discontinuous points appear and the upper surface metalized pattern lengths are plotted and the relation line 50 was obtained. The oblique line portion indicates the region where the discontinuous characteristic appears.

Generally, this type of ultra-high frequency semiconductor device is operated in an operation frequency band having a center frequency of 14.25 GHz. The operation frequency band width is about 4 to 15% of the center frequency. To say with respect to the upper limit frequency, it is about 2 to 7.5% of the center frequency. Therefore, when the semiconductor device is to be operated at a frequency point where the frequency is higher than the center frequency by 10%, $0.212 \lambda_g$ can be employed as the upper surface metalized pattern length. Also, when the semiconductor device is to have a frequency margin of a few hundreds of MHz from the frequency higher frequency higher than the center frequency by 10%, the frequency point of 20% is selected and $\lambda_g/6$ is employed as the upper surface metalized pattern length. It should be noted that the length L of the upper surface metalized pattern 5 preferably has a value near to $0.25 \lambda_g$ to increase the stability of the semiconductor device in a DC (direct current component) manner. Therefore, the upper surface metalized pattern length is preferably to be shorter than $0.25 \lambda_g$ and longer than $0.15 \lambda_g$.

Figure 9:
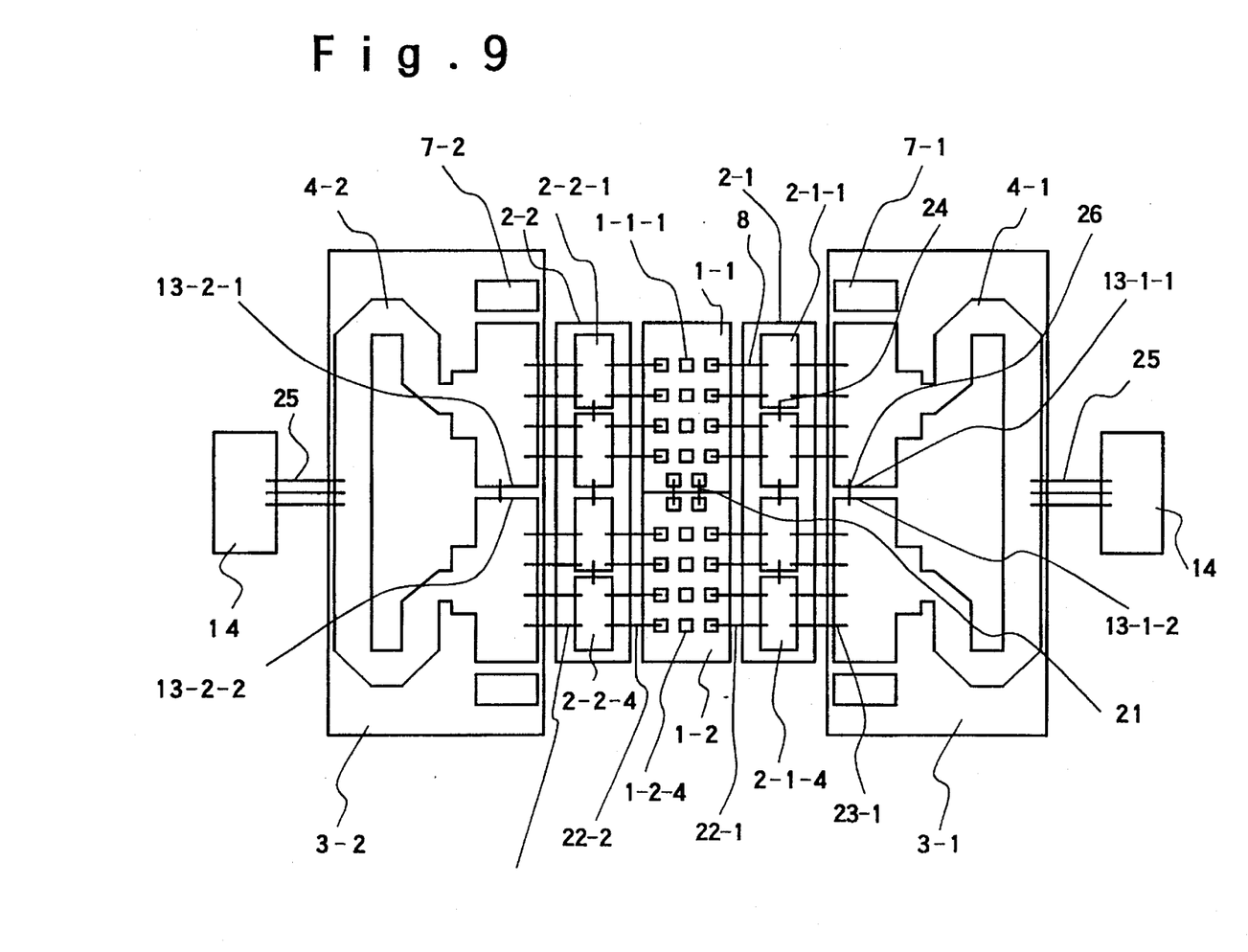
FIG. 9 is a plan view of a semiconductor device according to another embodiment of the present invention.

Next, the semiconductor device according to another embodiment of the present invention will be described. As described above, the inventor made many samples. Among the samples, there are some semiconductor devices in which the operation is not in a stable state. The inventor investigated the causes and found that such an unstable operation state is caused due to unbalance between the FET chips in the characteristic of the FET element or unbalance between the chip capacitors in the capacitance caused from the fixing process of the capacitor chip to the package. Therefore, as shown in FIG. 9, to remove the DC component unbalance, bonding wires are added to the semiconductor device shown in FIG. 4. More particularly, adjacent upper surface metalized patterns 5 are connected to each other by a bonding wire 24 and the branch ports are connected to each other by a bonding wire 26. As a result, the stable operation state of the semiconductor device can be obtained. It should be noted that only the bonding wire 24 or 26 may be provided or both the bonding wire 24 and 26 may be provided.

As described above, according to the present invention, there is the advantage in that a plurality of upper surface metalized patterns are formed on the upper surface of the input/output chip capacitors in the internal concentrated parameter matching circuit to each have the electrical length in such a manner that the input impedance of the chip capacitors acts as a capacitance component at the upper limit frequency of a practical operation frequency band of the semiconductor device. Also, by connecting between the adjacent upper surface metalized patterns and/or the branch ports by the bonding wires, there can be obtained the advantage in that the operation state of the semiconductor device is made uniform and can be stabilized.

What is claimed is:

1. An ultra-high frequency semiconductor device comprising:

Field Effect transistor (FET) chips, each including FET elements, said FET chips being connected to each other by bonding wires;

capacitor chips provided on input and output sides of said FET chips and including a plurality of chip capacitors each of which being connected to corresponding ones of said FET elements; and dielectric substance substrates, each of which has open stub patterns and a microstrip transmission line formed thereon, each said microstrip transmission line being connected to said corresponding chip capacitors by bonding wires;

wherein each of said chip capacitors has a length predetermined based on a frequency band used in practice;

wherein each of said microstrip transmission lines has branch ports provided with a gap; and wherein said semiconductor device further comprises a bonding wire connected between the branch ports.

2. The ultra-high frequency semiconductor device according to claim 1, further comprising bonding wires for connecting, on said input and output sides, adjacent ones of said plurality of chip capacitors.

3. The ultra-high frequency semiconductor device according to claim 1, wherein said length is predetermined such that an input impedance of each of said chip capacitors is capacitive at an upper limit frequency of the frequency band.

4. An ultra-high frequency semiconductor device comprising:

Field Effect transistor (FET) chips, each including FET elements, said FET chips being connected to each other by bonding wires, and an internal matching circuit having a concentrated parameter circuit and a distributed parameter circuit;

wherein said concentrated parameter circuit includes capacitor chips provided on input and output sides of said FET chips and including a plurality of chip capacitors each of which is connected to said corresponding FET elements;

wherein each of said chip capacitors has a length predetermined based on a frequency band used in practice;

wherein said distributed parameter circuit includes a microstrip line having branch ports provided with a gap; and wherein said semiconductor device further comprises a bonding wire connected between the branch ports.

5. The ultra-high frequency semiconductor device according to claim 4, further comprising bonding wires for connecting, on said input and output sides, adjacent ones of said plurality of chip capacitors.

6. The ultra-high frequency semiconductor device according to claim 4, wherein said length is predetermined such that an input impedance of each of said chip capacitors is capacitive at an upper limit frequency of the frequency band.

7. An ultra-high frequency semiconductor device comprising:

FET chips each of which includes GaAs MES FET elements and which are connected to each other by bonding wires, capacitor chips provided on input and output sides of said FET chips, wherein each of said capacitor chips includes a dielectric substance, a lower surface metalized pattern formed on a whole lower surface of said dielectric substance and upper surface metalized patterns, wherein said lower surface metalized pattern, said dielectric substance, and each of said upper surface metalized patterns constitute one chip capacitor, and wherein said each upper surface metalized pattern is connected to said corresponding GaAs MES FET elements, and dielectric substance substrates, each of which has open stub patterns and a microstrip transmission line formed thereon, and each said microstrip transmission line being connected to said corresponding chip capacitors by bonding wires;

wherein a length of said upper surface metalized pattern is predetermined based on a frequency band used in practice;

wherein each of said microstrip transmission lines has branch ports provided with a gap; and wherein said semiconductor device further comprises a bonding wire connected between the branch ports.

8. The ultra-high frequency semiconductor device according to claim 7, further comprising bonding wires connecting adjacent ones of said upper surface metalized patterns of said chip capacitors.

9. The ultra-high frequency semiconductor device according to claim 7, wherein said length is predetermined such that an input impedance of each of said chip capacitors is capacitive at an upper limit frequency of the frequency band.

10. An ultra-high frequency semiconductor device, comprising:

Field Effect transistor (FET) chips each of which includes FET elements and which are connected to each other by bonding wires, and an internal matching circuit having a concentrated parameter circuit and a distributed parameter circuit;

wherein said concentrated parameter circuit includes capacitor chips provided on input and output sides of said FET chips and includes a plurality of chip capacitors each of which is connected to said corresponding FET elements;

wherein each of said chip capacitors has a length predetermined such that a resonance frequency does not exist in a frequency band used in practice;

wherein said distributed parameter circuit includes a microstrip line having branch ports provided with a gap; and wherein said semiconductor device further comprises a bonding wire connected between the branch ports.

11. The ultra-high frequency semiconductor device according to claim 10, further comprising bonding wires connecting, on said input and output sides, adjacent ones of said chip capacitors.

12. The ultra-high frequency semiconductor device according to claim 10, wherein said length is predetermined such that an input impedance of each of said chip capacitors is capacitive at an upper limit frequency of the frequency band.

13. The ultra-high frequency semiconductor device according to claim 10, wherein said length is shorter than 0.25 $\lambda_g$ and longer than 0.15 $\lambda_g$, where $\lambda_g$ is a wave length corresponding to a center frequency of the frequency band.

* * * * *